United States Patent
Eisele

(10) Patent No.: US 6,931,697 B1
(45) Date of Patent: Aug. 23, 2005

(54) METHOD FOR PRODUCING PIEZO ACTUATORS WITH A MULTIPLE-LAYER STRUCTURE OF PIEZO LAYERS

(75) Inventor: Ulrich Eisele, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 430 days.

(21) Appl. No.: 10/069,309

(22) PCT Filed: Aug. 10, 2000

(86) PCT No.: PCT/DE00/02669

§ 371 (c)(1),
(2), (4) Date: May 14, 2002

(87) PCT Pub. No.: WO01/13440

PCT Pub. Date: Feb. 22, 2001

(30) Foreign Application Priority Data

Aug. 13, 1999 (DE) .................. 199 38 456

(51) Int. Cl.[7] ........................ H04R 17/00
(52) U.S. Cl. ............... 29/25.35; 29/33 S; 29/435; 29/456; 29/458; 310/369; 492/43; 492/44
(58) Field of Search ............ 29/25.35, 25.41, 29/25.42, 605, 33 F, 33 S, 435, 456, 458, 29/461; 310/328, 366, 367, 369; 428/323; 492/42–44

(56) References Cited

U.S. PATENT DOCUMENTS 4,821,390 A * 4/1989 Seyler ................ 29/456
4,870,742 A * 10/1989 Roloff ................ 29/33 S
5,241,235 A * 8/1993 Culp .................. 310/328
5,559,387 A * 9/1996 Beurrier .............. 310/328

FOREIGN PATENT DOCUMENTS

WO       99 13681 A      3/1999

OTHER PUBLICATIONS

Patent Abstracts of Japan vol. 017, No. 356 (E-1394), Jul. 6, 1993 & JP 05 055659 A, Mar. 5, 1993.
Patent Abstracts ofjapan vol. 017, No. 466 (E-1421), Aug. 25, 1993 & JP 05 110156 A, Apr. 30, 1993.
Patent Abstracts of Japan vol. 017, No. 115 (E-1330) Mar. 10, 1993 & JP 04 295 286 A, Oct. 20, 1992.

* cited by examiner

Primary Examiner—Peter Vo
Assistant Examiner—Donghai D. Nguyen
(74) Attorney, Agent, or Firm—Michael J. Striker

(57) ABSTRACT

A method for producing a piezoelectric actuator (8) with a multilayer structure of layers of a piezoelectric sheet (3, 4), and with inner electrodes disposed between them, is proposed, in which the individual layers are formed of two continuous strands (3, 4) of the piezoelectric sheet, and the two strands (3, 4) are wound over one another in the form of a double helix to form a hollow-cylindrical stack, thereby enclosing the inner electrode between them. The two strands (3, 5) are preferably guided over deflection rollers (5, 6, 7) in such a way that the overlays of the two strands (3, 4) on the already-wound stack are offset from one another by a predetermined angular amount.

8 Claims, 2 Drawing Sheets

METHOD FOR PRODUCING PIEZO ACTUATORS WITH A MULTIPLE-LAYER STRUCTURE OF PIEZO LAYERS

BACKGROUND OF THE INVENTION

The invention relates to a method for producing piezoelectric actuators with a multilayer structure of piezoelectric layers, for instance for a piezoelectric actuator for actuating a mechanical component such as a valve or the like and to an apparatus for performing the method.

It is well known to produce piezoelectric actuators with piezoelectric elements to utilize the so-called piezoelectric effect, these piezoelectric actuators being constructed of a material with a suitable crystalline structure. The construction of this piezoelectric actuator is done here in a plurality of layers (multilayer piezoelectric actuators), and the electrodes by way of which the electrical voltage is applied are each disposed between the layers. These piezoelectric multilayer actuators are produced conventionally by sheet casting, printing of the electrodes, and lamination. The printing, intermediate drying and lamination are so-called batch processes in this case. The piezoelectric actuators have several hundred laminate layers, and the contacting is done by means of two electrodes mounted on the sides. The inner electrodes must end in alternation in the interior of the actuator, because otherwise there would be a short circuit to the respective opposite pole. On these ends, mechanical stresses occur in operation, which can cause harmful cracks to develop, and the growth of these cracks during operation in the final analysis limits the service life of the piezoelectric actuator.

When an external electrical voltage is applied to the inner electrodes, a mechanical reaction of the piezoelectric element ensues, which as a function of the crystalline structure and the direction of the electrical voltage represents a pressure or tension in a predeterminable direction. Electrical charging of the piezoceramic stack causes these layers to expand or contract. The associated reciprocation of the piezoelectric stack can be used to switch a valve, for instance for controlling fuel metering in an internal combustion engine.

SUMMARY OF THE INVENTION

A method for producing a piezoelectric actuator with a multilayer structure of layers of a piezoelectric sheet and with inner electrodes disposed between them is advantageously further embodied in that the individual layers are formed of two continuous strands, for instance with a trapezoidal cross section, of the piezoelectric sheet, and the two strands are wound over one another in the form of a double helix to form a hollow-cylindrical stack, thereby enclosing the inner electrode between them.

With the invention, a double helix piezoelectric actuator can be formed in a simple way, in which because of the advantageous construction, the risk of failure from cracking as described at the outset is greatly reduced. Here, two dielectric electrode pairs insulated from one another are present in the form of a double helix. The piezoelectric actuator takes the form of a hollow cylinder, and the two inner electrodes have only one end on a face end of the piezoelectric actuator where the external contacting takes place. By means of the continuous production process, the batch processes mentioned above and the disadvantages in the operation of the piezoelectric actuator produced in that way are avoided.

In a preferred embodiment, the two strands are guided over deflection rollers in such a way that the overlays of the two strands on the already-wound stack are offset from one another by a predetermined angular amount. Here the predetermined angular amount can be approximately 150°.

The inner electrodes can be placed between the coiled layers in a simple way, by providing that the two strands, while being guided over the deflection rollers, are provided with an electrode paste by means of one further roller. In addition, the two strands, in the region of the overlay on the already-wound stack, can each be pressed against the stack with a respective contact-pressure roller.

In an advantageous embodiment of the method of the invention, the two strands are each extruded from a piezoelectric compound by means of an extruder nozzle, then wound around an empty tube, and after reaching a predetermined length are cut off. The stack can then be sintered in a thermal process, in the course of which the empty tube is also removed. For many applications, such as piezoelectrically performing a direct fuel injection, a piezoelectric actuator with a central bore is provided, which automatically occurs as a result of the structural form proposed here.

An advantageous apparatus for employing the above-described method has an extruder nozzle for forming the strands, three deflection rollers for guiding the strands, two contact-pressure rollers for applying the strands to the stack, at least one pressure roller for applying an electrode paste, and an empty tube for centering the hollow-cylindrical stack.

These and other characteristics of preferred refinements of the invention can be learned not only from the claims but also from the description and the drawings; the individual characteristics can each be realized on their own or a plurality of them can be made into subcombinations in the embodiment of the invention and used in other fields, and can advantageously represent intrinsically patentable embodiments for which patent protection is claimed here.

BRIEF DESCRIPTION OF THE DRAWINGS

One exemplary embodiment of an apparatus for employing the method of the invention for producing a multilayer piezoelectric actuator will be describe in conjunction with the drawing. Shown are.

DETAILED DESCRIPTION OF THE PREFERRED EMBODIMENTS

Figure 1:
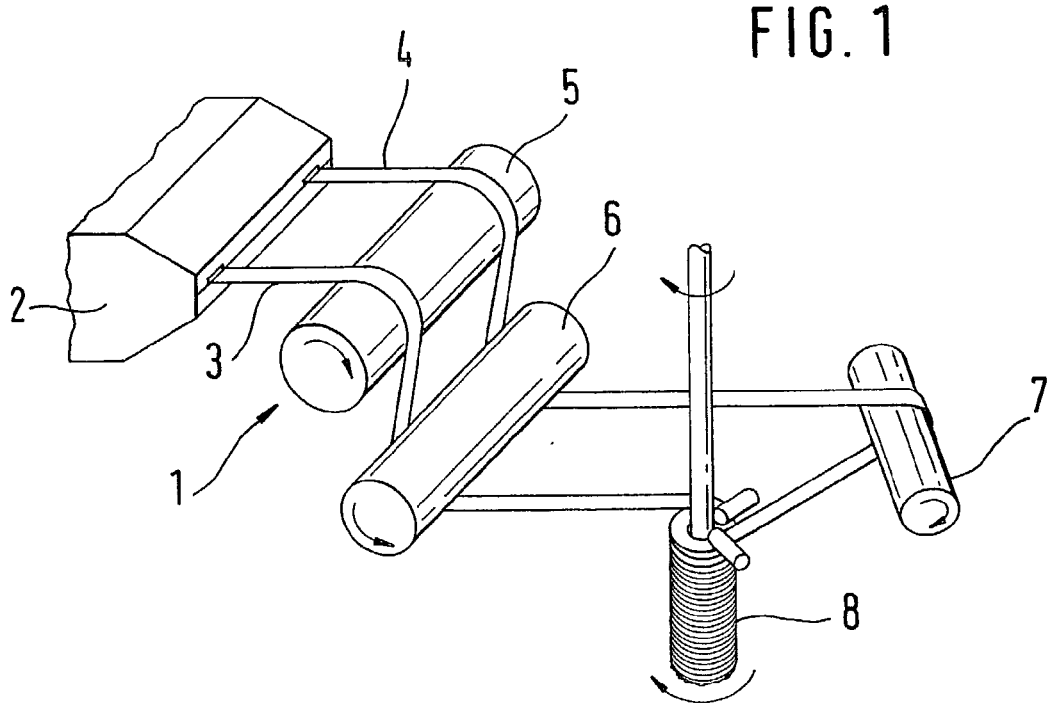
FIG. 1, a schematic view of the apparatus for performing a double helix construction of piezoelectric layers.

An apparatus 1 of FIG. 1 includes an extruder 2, with which two parallel strands 3 and 4 of a special piezoelectric compound are extruded from appropriate nozzles. Both strands 3 and 4 have a trapezoidal cross section, in order to compensate for the greater deformation on the outside that occurs during winding. The strands 3 and 4 are guided parallel over a first deflection roller 5 and a second deflection roller 6. A third deflection roller 7 guides one of the strands 4, deflected in the opposite direction and back by about 30°, in such a way that the two strands 3 and 4 are then wound, offset by about 150°, onto the already-finished windings of the stack of the piezoelectric actuator 8.

Figure 2:
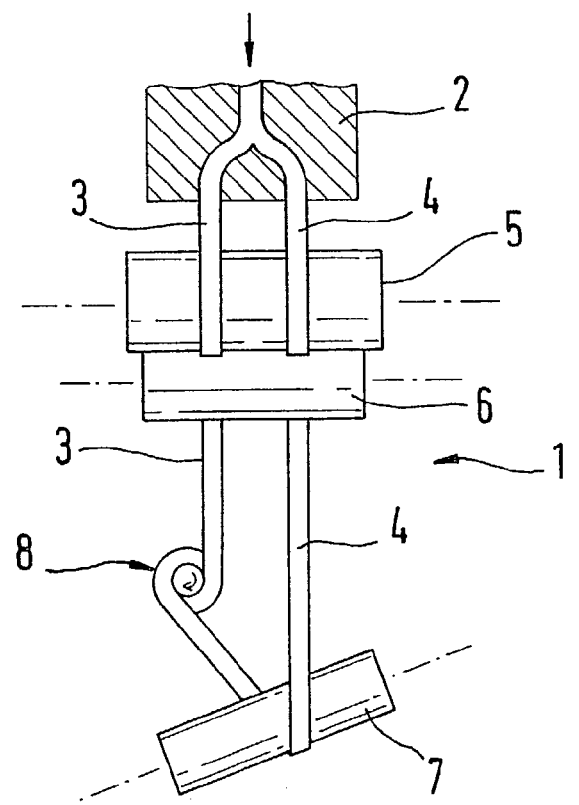
FIG. 2, a plan view on the arrangement of FIG. 1.
Figure 3:
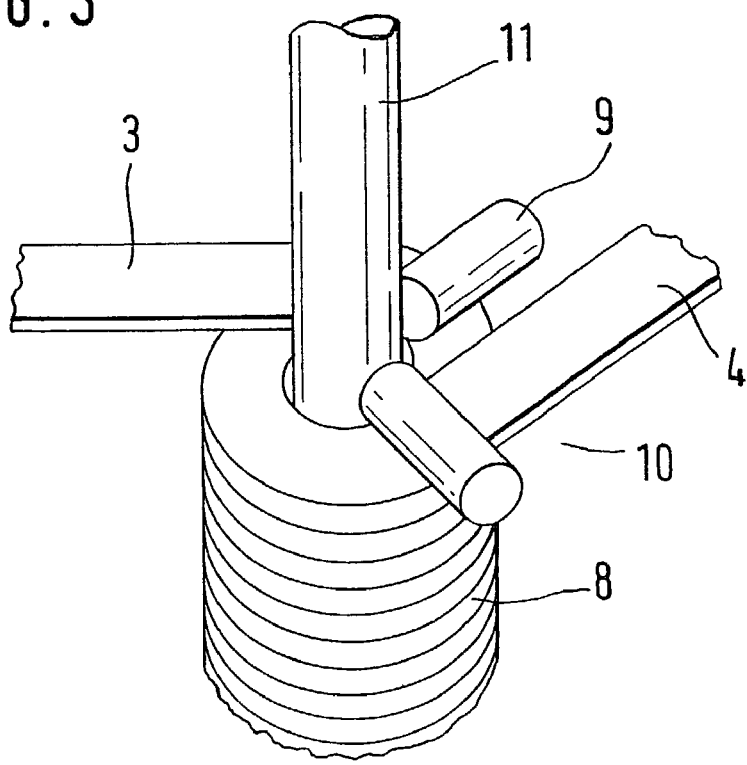
FIG. 3, a detail view of contact-pressure rollers as the strands are coiled onto the stack.

FIG. 2 shows the apparatus 1 of FIG. 1 again in a plan view. FIG. 3 shows the forming of the stack of the piezoelectric actuator 8 in detail; here in particular one contact-pressure roller 9 for the strand 3 and another contact-pressure roller 10 can be seen clearly. The contact-pressure rollers 9 and 10 press the respective strands 3 and 4 against the lower winding and thus assure a good connection of the layers of the stack of the piezoelectric actuator 8. An empty tube 11 of plastic, which can be delivered from above, here assures good centering of the stack of the piezoelectric actuator 8.

Figure 4:
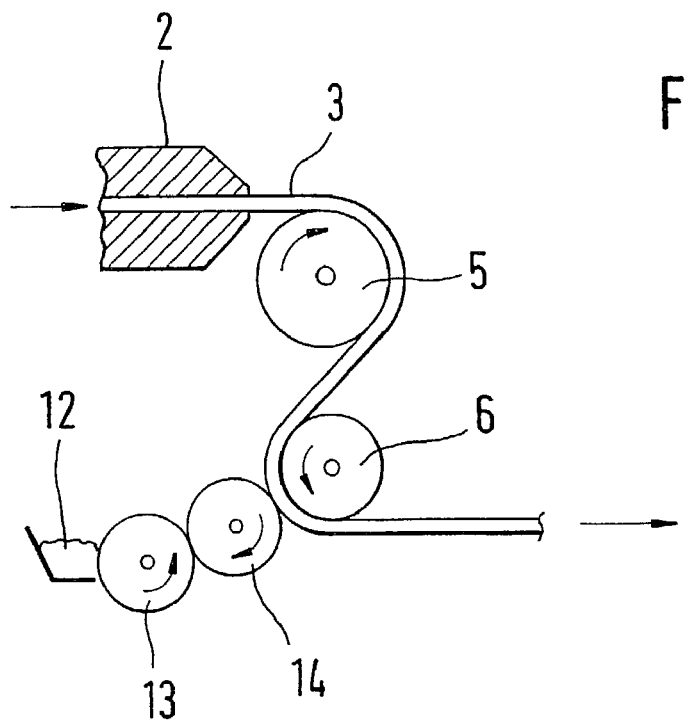
FIG. 4, a detail view of printing the electrode paste onto the strands, for forming the inner electrodes.

FIG. 4 shows one possible way of applying an electrode paste 12 to the strands 3 and 4. Applying this paste is done here via rollers 13 and 14 onto one side of the strands 3 and 4, by rolling the paste 12 on during the production of the winding. During the production, this accordingly creates an infinitely long base body of the piezoelectric actuator 8, which can be cut to the size needed for the particular application. By a thermal treatment of the wound stack of the piezoelectric actuator 8, the process aids (binders, etc.) are removed from the compound and the electrode paste is also removed, and the empty tube 11 is destroyed. After that, the base body of the piezoelectric actuator 8 is sintered.

What is claimed is:

1. A method for producing a piezoelectric actuator (8) with a multilayer structure of layers of a piezoelectric sheet (3, 4), and with inner electrode disposed between layers of the piezoelectric sheet, comprising the steps of:
    forming two individual layers of two continuous strands (3, 4) of the piezoelectric sheet;
    providing an inner electrode between the layers of the continuous strands;
    winding the two strands (3, 4) over one another in the form of a double helix to form a hollow-cylindrical stack, thereby enclosing the inner electrode between the two continuous strands;
    pressing each of the two strands (3, 4) in a region of an overlay on the hollow-cylindrical stack, against a stack with a respective contact-pressure roller (9, 10).

2. The method according to claim 1, further comprising the step of guiding the two strands (3, 5) over deflection rollers (5, 6, 7) in such a way that the overlays of the two strands (3, 4) on the hollow-cylindrical stack are offset from one another by a predetermined angular amount.

3. The method according to claim 2, wherein the predetermined amount is approximately 150°.

4. The method according to claim 2, further comprising the step of providing the two strands with an electrode paste (12) by means of at least one further roller (13, 14).

5. The method according to claim 1, further comprising the step of providing the two strands (3, 4), while being guided over deflection rollers (5, 6), with an electrode paste (12) applied to a surface of the two continuous strands by means of at least one further roller (13, 14).

6. The method according to claim 5, wherein the strands (3, 4) have a trapezoidal cross section.

7. The method according to claim 1, wherein the strands (3, 4) have a trapezoidal cross section.

8. The method according to claim 1, further comprising the steps of:
    extruding the two strands (3, 4) from a piezoelectric compound by means of an extruder nozzle (2);
    winding the two strands (3, 4) around an empty tube (11);
    cutting the strands (3, 4) off after the two strands have reached a predetermined length;
    unbinding the stack in a thermal process; and
    removing the empty tube (11) by destruction.

* * * * *